US006294468B1

(12) United States Patent
Gould-Choquette et al.

(10) Patent No.: US 6,294,468 B1
(45) Date of Patent: Sep. 25, 2001

(54) METHOD OF CHEMICAL VAPOR DEPOSITING TUNGSTEN FILMS

(75) Inventors: Adrienne Gould-Choquette; Sailesh Merchant, both of Orlando, FL (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/517,965

(22) Filed: Mar. 3, 2000

Related U.S. Application Data

(60) Provisional application No. 60/135,564, filed on May 24, 1999.

(51) Int. Cl.$^7$ ................................................. H01L 21/44
(52) U.S. Cl. ..................... 438/680; 438/685; 438/656; 438/648
(58) Field of Search .................................. 438/680, 685, 438/648, 656, 582

(56) References Cited

U.S. PATENT DOCUMENTS

| | | | |
|---|---|---|---|
| 5,374,594 | 12/1994 | van de Ven et al. | 437/247 |
| 5,489,552 | 2/1996 | Merchant et al. | 437/192 |
| 5,679,405 | 10/1997 | Thomas et al. | 427/248.1 |
| 5,795,824 | 8/1998 | Hancock | 438/656 |
| 5,840,366 | 11/1998 | Mizuno et al. | 427/250 |
| 5,843,233 | * 12/1998 | van de Ven et al. | 118/715 |
| 5,879,973 | * 3/1999 | Yanai et al. | 438/161 |
| 5,882,417 | 3/1999 | van de Ven et al. | 118/728 |
| 5,883,434 | * 3/1999 | Noguchi | 257/750 |

FOREIGN PATENT DOCUMENTS

| | | | |
|---|---|---|---|
| 0 372 861 A2 | 12/1989 | (EP) | H01L/21/3205 |
| 0 651 436 A1 | 10/1994 | (EP) | H01L/21/3205 |
| 0 857 795 A1 | 1/1998 | (EP) | C23C/16/02 |

OTHER PUBLICATIONS

Patent Abstracts of Japan, vol. 013, No. 429, Sep. 25, 1989 & JP 01 160011A, Fujitsu Ltd., Jun. 22, 1989.

* cited by examiner

Primary Examiner—Charles Bowers
Assistant Examiner—Thanh Nguyen
(74) Attorney, Agent, or Firm—Allen, Dyer, Doppelt, Milbrath & Gilchrist, P.A.

(57) ABSTRACT

A method of depositing tungsten on a semiconductor substrate is disclosed. The semiconductor substrate is heated to between about 360° C. and about 390° C. and preferably about 375° C. Initiation gases are introduced into a first deposition station of a chemical vapor deposition chamber to form an amorphous, monolayer of silicon. Initiation gas comprises a silane gas flow at a rate of about 40 to about 48 standard cubic centimeters per minute. A nucleation gas flow rate formed of silane of about 20 to about 30 standard cubic centimeters per minute and a tungsten hexafluoride gas flow at a rate of about 300 to about 350 standard cubic standard centimeters per minute is next introduced. A hydrogen reducing gas flow rate is then introduced to form a layer of hydrogen reduced bulk tungsten. This reduced gas flow comprises a hydrogen gas flow at a rate of about 7,000 to about 8,500 standard cubic centimeters per minute gas flow, and a tungsten hexafluoride gas flow at a rate of about 300 to about 350 standard cubic centimeters per minute. A bulk hydrogen reduced tungsten is deposited at successive deposition stations.

28 Claims, 3 Drawing Sheets

METHOD OF CHEMICAL VAPOR DEPOSITING TUNGSTEN FILMS

RELATED APPLICATION

This application is based upon prior filed copending provisional application Serial No. 60/135,564 filed May 24, 1999.

FIELD OF THE INVENTION

This invention relates to the field of semiconductor manufacturing, and more particularly, this invention relates to the chemical vapor deposition of a tungsten film on a semiconductor substrate.

BACKGROUND OF THE INVENTION

Tungsten (W) films are deposited as a blanket layer using chemical vapor deposition (CVD) techniques during semiconductor manufacturing. The tungsten can be deposited through a chemical reduction of tungsten hexafluoride ($WF_6$) using a hydrogen ($H_2$) or silane ($SiH_4$). Usually, the tungsten is deposited at temperatures ranging from 425° C. to as high as 475° C., such as disclosed in the upper range of temperatures in U.S. Pat. No. 5,795,824. In this prior art process, tungsten film is grown on a semiconductor substrate by positioning the semiconductor substrate within a chemical vapor deposition chamber having a number of different pedestals that are heated. Initiation gases, such as hydrogen and silane, are provided to initiate a growth at temperature ranges of 350 to 475° C., followed by nucleation with a gas flow that replaces the initiation gases, where tungsten film is formed at a rate in excess of approximately 100 NM/MIN on the surface. The hydrogen and silane gas flow occurs without argon gas at a first pedestal. The substrate is repositioned at a second deposition station or pedestal within the deposition chamber, followed by successive positioning at other pedestals.

However, the current chemical vapor deposition tungsten processes are not adaptable for use with low-K dielectrics because the stability of dielectrics are compromised by the high tungsten deposition temperatures of 425 to 450° C. Thus, those processes that can be used with these higher temperatures are not adaptable for use with the low-K dielectrics requiring low temperature applications. It is difficult to fabricate any chemical vapor deposition tungsten plugs at temperatures around 375° C. without extensive hardware modifications. More optimal gas species combinations, gas flows and gas flow sequences are required in the chemical vapor deposition chambers, such that a low resistivity, high reflectivity, and smaller grain size tungsten plug could be obtained at the lower temperatures compared to the prior art using the 425 to 450° C. range. It would also be advantageous if there could be little hardware changes to existing chemical vapor deposition chambers. Instead, changes in the gas flow and gas species combinations and gas flow sequences are the better design choice.

SUMMARY OF THE INVENTION

It is therefore an object of the present invention to provide a method for depositing tungsten at low temperatures of about 360 to about 390° C. onto a semiconductor substrate having low-K dielectric materials.

In accordance with the present invention, a method for depositing tungsten on a semiconductor substrate comprises the step of receiving the semiconductor substrate at a first deposition station within a chemical vapor deposition chamber having a plurality of discrete deposition stations. The semiconductor substrate is heated to a temperature between about 360 and about 390° C. Initiation gases are introduced into the first deposition station to form an amorphous, monolayer of silicon. The initiation gases comprise a silane ($SiH_4$) gas that flows at a rate of about 40 to about 48 standard cubic centimeters per minute.

Nucleation gases are introduced into the first deposition station to form a silane reduced tungsten layer. These nucleation gases comprise a silane gas flow of about 20 to about 30 standard cubic centimeters per minute and a tungsten hexafluoride ($WF_6$) gas that flows at a rate of about 300 to about 350 standard cubic centimeters per minute.

The hydrogen reducing gas flow is introduced to form a layer of hydrogen reduced bulk tungsten. The hydrogen reducing gas flow comprises a hydrogen gas flow of about 7,000 to about 8,500 standard cubic centimeters per minute gas flow and a tungsten hexafluoride gas flow of about 300 to about 350 standard cubic centimeters per minute. A bulk hydrogen reduced tungsten is then deposited at successive deposition stations.

In another aspect of the present invention, a continuous flow of argon is introduced with the initiation and nucleation gas flows. Argon can be introduced in a continuous flow rate of about 10,000 to about 12,000 standard cubic centimeters per minute with the initiation and nucleation gas flows. In one aspect of the present invention, there are five deposition stations and argon is introduced at a continuous flow rate of about 10,000 to about 12,000 standard cubic centimeters per minute at all deposition stations. The total tungsten film thickness can be about 3,000 angstroms. Hydrogen gas flow can also be introduced at a gas flow of about 7,000 to about 8,500 standard cubic centimeters per minute with the initiation gas flow. In still another aspect of the present invention, the semiconductor substrate is heated to about 375° C.

In still another aspect of the present invention, the process for depositing tungsten on a semiconductor substrate comprises the steps of receiving the semiconductor substrate at a first deposition station within a chemical vapor deposition chamber having a plurality of discrete deposition stations. The semiconductor substrate is heated to a temperature between about 360 and about 390° C. Initiation gases are introduced for about 10 seconds into the first deposition station to form an amorphous, monolayer of silicon The initiation gases comprise a silane ($SiH_4$) gas flow at a rate of about 40 to about 48 standard cubic centimeters per minute.

Nucleation gases are then introduced for about 10 seconds into the first deposition station to form a silane reduced tungsten layer of about 400 angstroms. The nucleation gases comprise a silane gas flow of about 20 to about 30 standard cubic centimeters per minute and a tungsten hexafluoride ($WF_6$) gas flow of about 300 to about 350 standard cubic centimeters per minute. A hydrogen reducing gas flow is introduced for about 20 seconds into the first deposition station to form a layer of hydrogen reduced bulk tungsten of about 370 angstroms. The hydrogen reducing gas flow comprises a hydrogen gas flow of about 7,000 to about 8,500 standard cubic centimeters per minute gas flow, and a tungsten hexafluoride gas flow rate of about 300 to about 350 standard cubic centimeters per minute.

The semiconductor substrate is then received into successive deposition stations. At each successive deposition station, a gas flow is introduced for about 30 seconds to deposit a bulk, hydrogen reduced tungsten. The gas flow comprises a tungsten hexafluoride gas flowing at a rate of about 300 to about 350 standard cubic centimeters per minute and hydrogen flowing at a rate of about 7,000 to about 8,500 standard cubic centimeters per minute.

In yet another aspect of the present invention, the semiconductor substrate is received on a heated platen at a first deposition station within a chemical vapor deposition chamber that has a plurality of discrete deposition stations with heated platens. The heated platens heat the semiconductor substrate to between about 360 to about 390° C., and preferably to about 375° C. At the same time, a backside gas flow is introduced against the semiconductor substrate and heated platen for preventing backside deposition and preventing front side edge deposition, e.g., edge exclusion, and maintaining the backside gas flow in subsequent processing.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention is advantageous because it now permits the tungsten chemical vapor deposition of devices containing low-K dielectrics at low temperatures, such as around 360° C. to about 390° C., and preferably around 375° C. The present invention is also advantageous because the low temperatures form grain sizes of tungsten that more readily fill the voids. Also, there are no major hardware modifications necessary for the practice of the present invention. These dielectrics have low thermal budgets and cannot be processed by those well known techniques and methods of prior art using higher temperature tungsten deposition temperatures of about 425° C. to about 450° C. With the method of the present invention, chemical vapor deposited tungsten plugs can now be fabricated with a semiconductor material having a low-K dielectric material, such as those organic spin-on dielectrics known to those skilled in the art. These dielectrics can be integrated into the process of the present invention.

As known to those skilled in the art, these low-K organic spin-on dielectrics and other similar dielectrics have a thermal stability problem above about 375° C. to about 390° C. The resultant film structure of the present invention reduces the propensity to defects caused by gas phase nucleation of tungsten and ensures robustness against $WF_6$ attack on Ti under layers (volcanos), and provides a low stress film. These factors provide a CVD-W deposition process that is necessary for a successful integration of a low-K dielectric material that loses stability if used in conjunction with prior art tungsten deposition processes.

Figure 1:
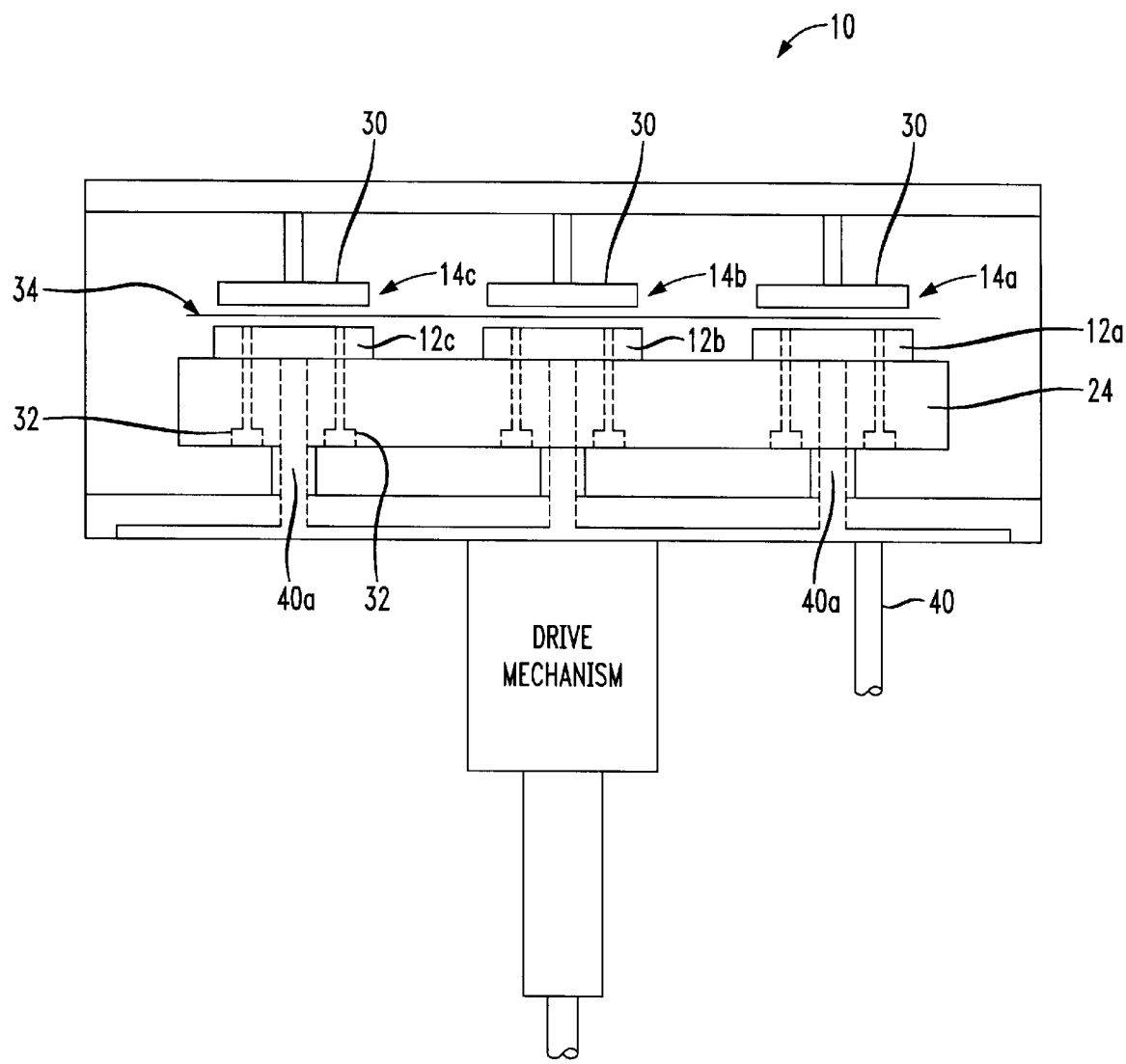
FIG. 1 is a schematic, cross-sectional view of a multi-station, sequential chemical vapor deposition chamber that could be used for the present invention.
Figure 2:
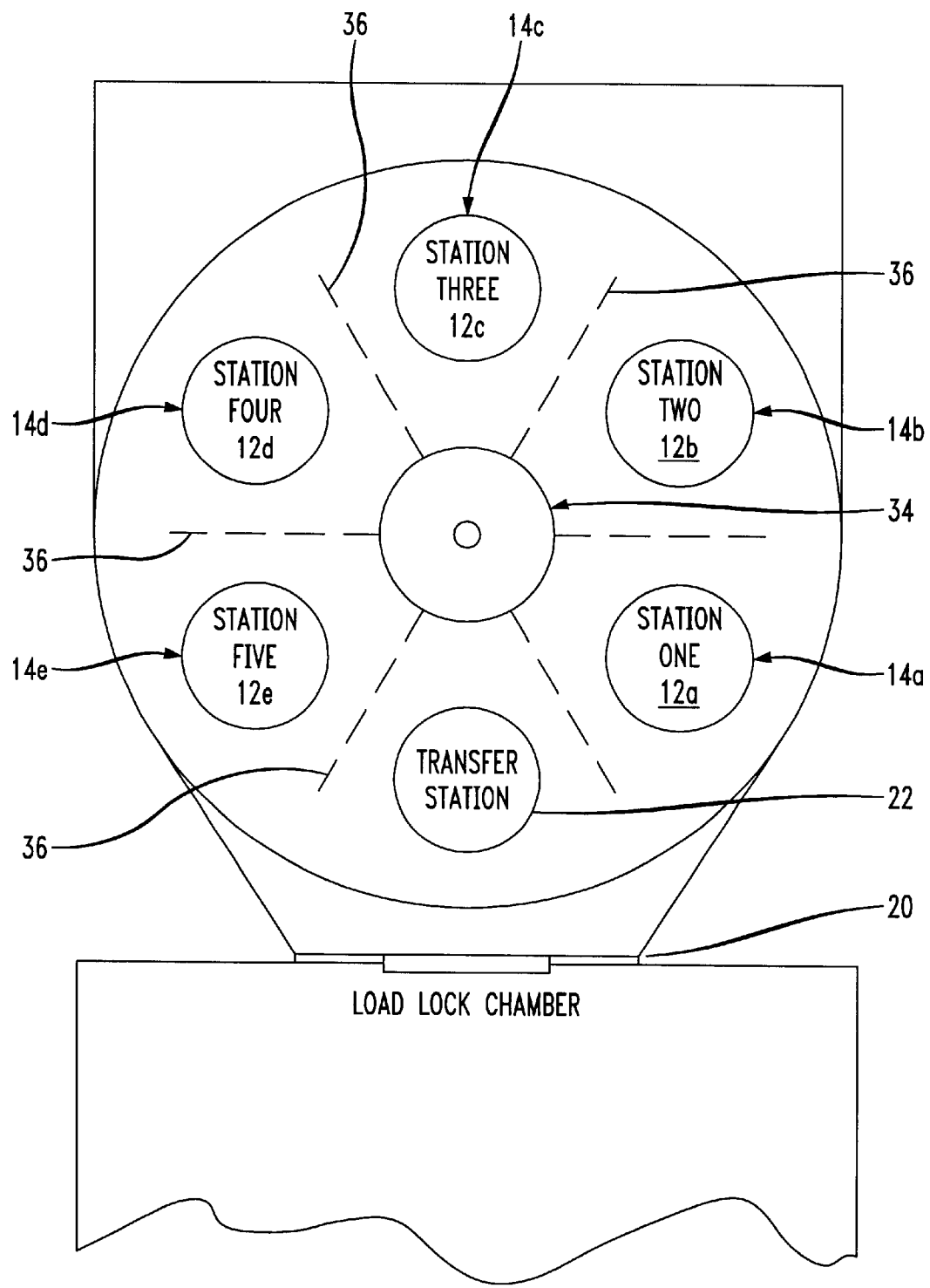
FIG. 2 is a schematic, top plan view of the chemical vapor deposition chamber shown in FIG. 1.

FIG. 1 illustrates a chemical vapor deposition chamber 10 that can be used with the present invention. The chamber 10 uses multi-station sequential deposition architecture, such as shown in FIG. 2, where five pedestals 12a–e are positioned in a circular arrangement to form five deposition stations 14a–e corresponding to the respective five pedestals. Each pedestal is formed as a platen for holding the semiconductor substrate or wafer indicated by a "W". Multiple wafers can be processed sequentially and receive a portion of their total deposition thickness at the separate and discrete deposition stations. An example of the type of chemical vapor deposition chamber that can be used in the present invention is a Novellus Altus Concept Two chemical vapor deposition chamber.

As any wafers move to successive stations 14a–e, a new wafer is introduced into the chemical vapor deposition chamber 10, while a completed wafer is removed. Each wafer is exposed to the same processing environment at each station. This type of multi-station sequential deposition architecture allows reproducibility on a fine scale. Because the tungsten film is deposited slowly over the successive steps at either stations 14a–e, this type of architecture averages out random process variations and yields uniform films. If any flaws are produced at one pedestal, e.g., where a partial deposition occurs only, the next pedestal deposition will even out the deposition flows and correct the defects.

Multi-station sequential deposition architecture is advantageous and it is possible to work with sub 0.25 micro technology. Wafers can be produced in excess of 110 wafers per hour (WPH) for thin films. The chamber includes a dual load lock and advanced wafer handling to increase system throughput.

As shown in the schematic cross-sectional view of FIG. 1 and the top plan view of FIG. 2, the chemical vapor deposition chamber 10 communicates with a load lock chamber 20 where wafers are introduced and received into and from the chamber 10. The five deposition or process stations 14a–e are located within the chamber. A transfer station 22 allows transfer of wafers from the load lock chamber 20 to the chamber 10 and onto the platens. Naturally, the chamber includes appropriate venting ports for gases.

Each deposition station includes the pedestal 12a–e that is heated by a heater assembly shown at 24, to provide heat to the platen semiconductor substrate. A gas dispersion head 30, also called a shower head in the industry, is positioned above each pedestal 12a–e and introduces the process gases over the wafer. Each pedestal, or platen, supports the wafer. A pedestal base 32 supports the heater assembly 24 for heating the platen and supplying heat to the wafer. A pin lift mechanism is indicated by the dotted lines at 32 and formed to raise and lower wafers of the platens to process and work in conjunction with a wafer transport mechanism 34 that moves wafers to the pedestals in succession. The wafer transport mechanism could be formed as rotary arms 36 (FIG. 2) that lift and move the wafers into successive stations.

An example of various types of chamber designs that could be used with the present invention are those types of designs shown in U.S. Pat. Nos. 5,374,594, 5,679,405, and 5,882,417, the disclosures which are hereby incorporated by reference in their entirety. During gas flow processing, a backside gas flow is introduced through backside gas flow discharge port 40 and through channels 40a onto the backside of the wafer to prevent backside deposition and front side edge deposit, as known to those skilled in the art.

Figure 3:
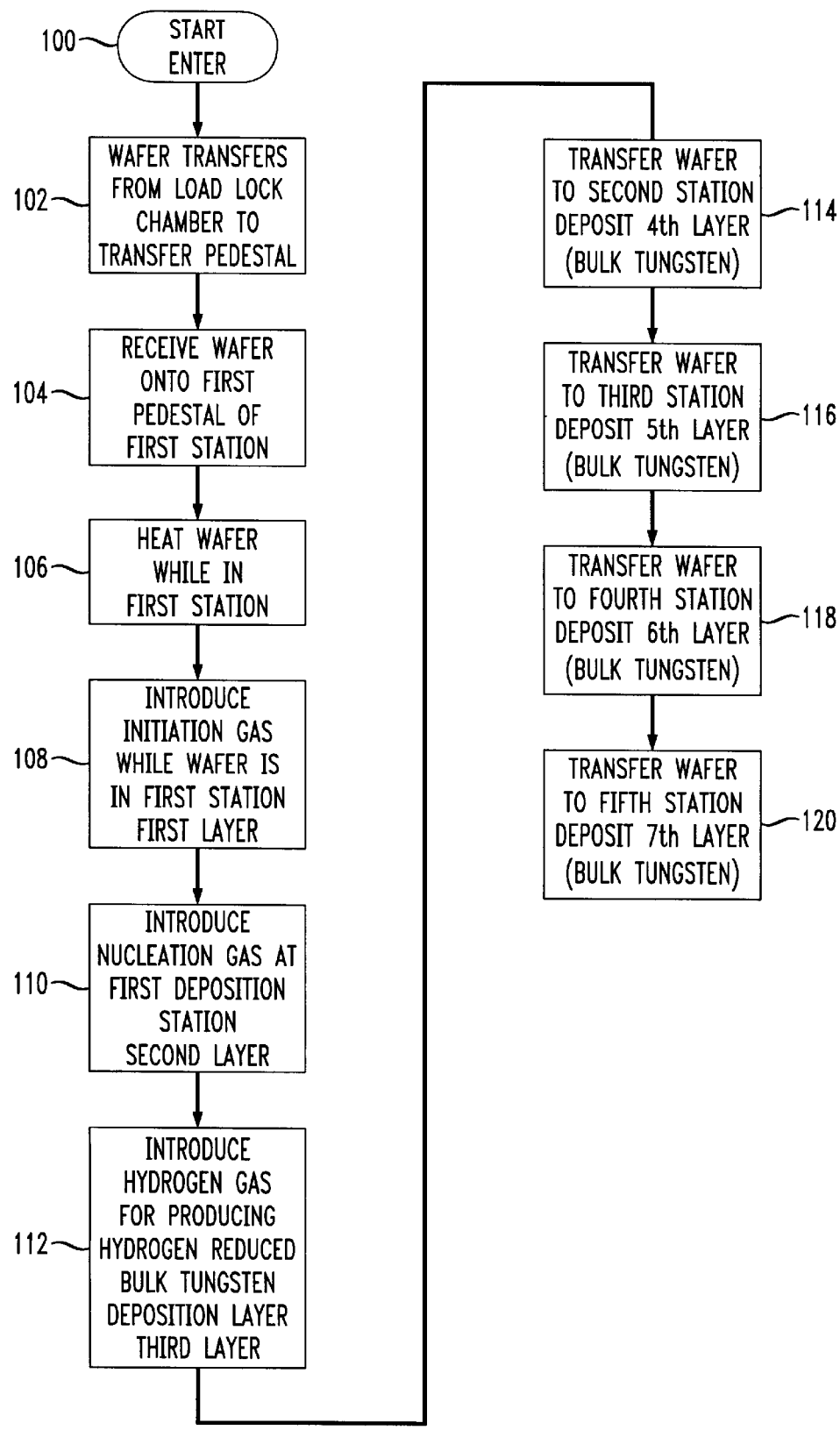
FIG. 3 is a flow chart illustrating the basic process of the present invention.

Referring now to the flow chart of FIG. 3, the basic method of the present invention is illustrated. For purposes of clarity, the term wafer and semiconductor substrate will be used interchangeably. In accordance with the process and method of the present invention, the process begins (block 100) and the wafer enters the load lock chamber and is transferred onto the transfer pedestal or station (block 102). The semiconductor substrate or wafer is then transferred and received at the first deposition station onto the pedestal within the chamber (block 104). The semiconductor substrate is heated to a temperature between about 360° C. and about 390° C. and preferably about 375° C. via the heater assembly and platen (block 106). The platen is set at a temperature about 15 degrees greater than the semiconductor wafer, i.e., substrate. An initiation gas is introduced for about ten seconds into the first deposition station onto the semiconductor substrate to form an amorphous, monolayer of silicon (block 108). This initiation gas comprises a silane ($SiH_4$) gas flow at a rate of about 40 to about 48 standard cubic centimeters per minute. Additionally, argon is continuously flowing at a rate of about 10,000 to about 12,000 standard cubic centimeters per minute. This sequence forms the first of seven layers. The first three layers occur at the first station 14a. This first, self-limiting, amorphous silicon layer is required to prevent long incubation times of chemically vapor deposited tungsten atop a titanium nitride (TiN) seed layer. This first layer also increases the subsequent tungsten film deposition rate and film uniformity and decreases subsequent film stress.

At the same time, a backside gas flow is introduced against a semiconductor substrate via heated platen for preventing backside deposition and front side edge deposit. This backside gas flow is maintained in subsequent processing. This backside gas flow is produced at all deposition stations 14a–e at all pedestals. The backside gas flow comprises an argon gas flow and a hydrogen gas flow, as known to those skilled in the art. Naturally, the amount of argon gas flow flowing from the shower head can vary and can be used to control the rate of reaction. However, for the present invention, an argon gas flow at a rate of about 10,000 to about 12,000 standard cubic centimeters per minute has been found advantageous.

The initiation gas is then terminated and a nucleation gas (block 110) introduced at the first deposition station to form a silane reduced tungsten layer. The nucleation gas comprises a silane gas flow of about 20 to about 30 standard cubic centimeters per minute, and a tungsten hexafluoride ($WF_6$) gas flow at a rate of about 300 to about 350 standard cubic centimeters per minute. This gas flow rate occurs for about ten seconds. The use of silane during tungsten growth helps prevent the reaction between tungsten hexafluoride and titanium silicide. During this step, hydrogen also flows and is introduced at a rate of about 7,000 to about 8,500 standard cubic centimeters per minute.

Because this reaction between silane and tungsten hexafluoride occurs rapidly, it has been found necessary to move to a slower reaction of hydrogen reduction of tungsten hexafluoride. A third layer of seven layers is produced at the first deposition station 14a at pedestal one 12a and is the first layer of a hydrogen reduced bulk tungsten deposition layer (block 112). A 370 angstrom tungsten film is formed via a 20 second reduction of tungsten hexafluoride by flowing 300 to 350 standard cubic centimeters per minute of tungsten hexafluoride and hydrogen flowing at 7,000 to 8,500 standard cubic centimeters per minute.

Once this third layer is completed, the wafer transport mechanism then moves the semiconductor substrate into respective deposition stations at pedestals 2–5 where layers 4–7 receive a bulk tungsten deposition (blocks 114, 116, 118 and 120). At each pedestal 12b, 12c, 12d and 12e, a 560 angstrom film of bulk, hydrogen reduced, tungsten is deposited. Tungsten hexafluoride can be introduced at a flow rate of 300 to 350 standard cubic centimeters per minute, and hydrogen can flow at a rate of 7,000 to 8,500 standard cubic centimeters per minute, each for about 30 seconds. This 30 second rate is based on a 3,000 angstrom total tungsten film thickness. However, by linearly increasing or decreasing the bulk fill duration, it is possible to increase or decrease the tungsten thickness respectively, as will be known to those skilled in the art. Once the final film layer is deposited, the semiconductor substrate is unloaded from the chamber 10.

The present invention is advantageous and provides a new and unobvious process that allows low temperature tungsten chemical vapor deposition in a multi-station sequential deposition system. Thus, it is now possible to reduce the propensity of defects caused by gas phase nucleation of tungsten and ensure robustness against $WF_6$ attack of Ti under layers (volcanos), and provide a low stress film at low temperature applications.

The following table shows a some of the operating parameters of the low temperature process versus a standard prior art process as could be used with the present invention.

TABLE I

| Process Parameters | | |
| --- | --- | --- |
| | Low Temperature | Standard |
| Pedestal temperature | 390° C. | 425° C. |
| Approx wafer temperature | 375° C. | 410° C. |
| Front side argon | 10,000–12,000 sccms | 7,500 sccms |
| Front side hydrogen | 7,000–8,000 sccms | 6,000 sccms |
| Silane (initiation layer) | 40–48 sccms | 40 sccms |
| Silane (seed layer) | 20–30 sccms | 40 sccms |
| Tungsten hexafluoride | 300–350 sccms | 400 sccms |
| Seed layer duration | 10 seconds | 8 seconds |
| Total station deposition time | 30 seconds | 15 seconds |

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A method for depositing tungsten on a semiconductor substrate comprising the steps of:

receiving the semiconductor substrate at a first deposition station within a chemical vapor deposition chamber having a plurality of discrete deposition stations;

heating the semiconductor substrate to a temperature between about 360 and about 390 degrees centigrade;

introducing initiation gases into the first deposition station to form an amorphous, monolayer of silicon, wherein the initiation gases comprise a silane ($SiH_4$) gas flow of about 40 to about 48 standard cubic centimeters per minute;

introducing nucleation gases into the first deposition station to form a silane reduced tungsten layer, wherein the nucleation gases comprise a silane gas flow of about 20 to about 30 standard cubic centimeters per minute and a tungsten hexafluoride ($WF_6$) gas flow of about 300 to about 350 standard cubic centimeters per minute;

introducing a hydrogen reducing gas flow to form a layer of hydrogen reduced bulk tungsten, wherein the hydrogen reducing gas flow comprises a hydrogen gas flow of about 7,000 to about 8,500 standard cubic centimeters per minute and a tungsten hexafluoride gas flow of about 300 to about 350 standard cubic centimeters per minute; and depositing at successive deposition stations a bulk, hydrogen reduced tungsten.

2. A method according to claim 1, and further comprising the step of introducing a continuous flow of argon with the initiation and nucleation gas flows.

3. A method according to claim 2, and further comprising the step of introducing argon at a continuous flow of about 10,000 to about 12,000 standard cubic centimeters per minute with the initiation and nucleation gas flows.

4. A method according to claim 2, and further comprising the step of introducing argon at a continuous flow of about 10,000 to about 12,000 standard cubic centimeters per minute at all deposition stations.

5. A method according to claim 1, wherein said deposition station comprises five deposition stations.

6. A method according to claim 1, and further comprising the steps of forming a 3,000 angstrom total tungsten film thickness in seven layers.

7. A method according to claim 1, and further comprising the step of introducing a hydrogen gas flow of about 7,000 to about 8,500 standard cubic centimeters per minute with the nucleation gas flow.

8. A method according to claim 1, wherein the semiconductor substrate is heated to about 375 degrees centigrade.

9. A method for depositing tungsten on a semiconductor substrate comprising the steps of:

receiving the semiconductor substrate at a first deposition station within a chemical vapor deposition chamber having a plurality of discrete deposition stations;

heating the semiconductor substrate to a temperature between about 360 and about 390 degrees centigrade;

introducing initiation gases for about 10 seconds into the first deposition station to form an amorphous, monolayer of silicon, wherein the initiation gases comprise a silane ($SiH_4$) gas flow of about 40 to about 48 standard cubic centimeters per minute;

introducing nucleation gases for about 10 seconds into the first deposition station to form a silane reduced tungsten layer of about 400 angstroms thickness, wherein the nucleation gases comprise a silane gas flow of about 20 to about 30 standard cubic centimeters per minute and a tungsten hexafluoride ($WF_6$) gas flow of about 300 to about 350 standard cubic centimeters per minute;

introducing a hydrogen reducing gas flow for about 20 seconds into the first deposition station to form a layer of hydrogen reduced bulk tungsten of about 370 angstroms, wherein the hydrogen reducing gas flow comprises a hydrogen gas flow of about 7,000 to about 8,500 standard cubic centimeters per minute and a tungsten hexafluoride gas flow of about 300 to about 350 standard cubic centimeters per minute;

receiving the semiconductor substrate into successive deposition stations; and introducing at each successive deposition station a gas flow for about 30 seconds to deposit a bulk, hydrogen reduced tungsten, said gas flow comprising tungsten hexafluoride flow of about 300 to about 350 standard cubic centimeters per minute and hydrogen flow of about 7,000 to about 8,500 standard cubic centimeters per minute.

10. A method according to claim 9, and further comprising the step of introducing a continuous flow of argon with the initiation and nucleation gas flow.

11. A method according to claim 10, and further comprising the step of introducing argon at a continuous flow rate of about 10,000 to about 12,000 standard cubic centimeters per minute with the initiation and nucleation gas flow.

12. A method according to claim 10, and further comprising the step of introducing argon at a continuous flow rate of about 10,000 to about 12,000 standard cubic centimeters per minute at all deposition stations.

13. A method according to claim 9, wherein said deposition station comprises five deposition stations.

14. A method according to claim 9, wherein each deposition station comprises a heated platen on which the semiconductor substrate is positioned.

15. A method according to claim 9, and further comprising the step of introducing a backside gas flow against the semiconductor substrate and heated platen for preventing backside deposition and front side edge deposit.

16. A method according to claim 9, wherein each semiconductor substrate is heated to about 375 degrees centigrade.

17. A method according to claim 1, and further comprising the step of forming a 3,000 angstrom total tungsten film thickness.

18. A method according to claim 9, wherein the backside gas flow comprises a gas flow of argon and hydrogen.

19. A method according to claim 9, and further comprising the step of introducing a hydrogen gas flow rate of about 7,000 to about 8,500 standard cubic centimeters per minute with the nucleation gas flow.

20. A method for depositing tungsten on a semiconductor substrate comprising the steps of:

receiving the semiconductor substrate on a heated platen at a first deposition station within a chemical vapor deposition chamber having a plurality of discrete deposition stations, each deposition chamber having a heated platen that heats the semiconductor substrate to between about 360 and about 390 degrees centigrade;

introducing initiation gases into the first deposition station to form an amorphous, monolayer of silicon, wherein the initiation gases comprise a silane ($SiH_4$) gas flow of about 40 about 48 standard cubic centimeters per minute while also introducing a backside gas flow against the semiconductor substrate and heated platen for preventing backside deposition and front side edge deposit and maintaining the backside gas flow in subsequent processing;

introducing nucleation gases into the first deposition station to form a silane reduced tungsten layer, wherein the nucleation gases comprise a silane gas flow of about 20 to about 30 standard cubic centimeters per minute and a tungsten hexafluoride ($WF_6$) gas flow of about 300 to about 350 standard cubic centimeters per minute;

introducing a hydrogen reducing gas flow to form a layer of hydrogen reduced bulk tungsten, wherein the hydrogen reducing gas flow comprises a hydrogen gas flow of about 7,000 to about 8,500 standard cubic centimeters per minute and a tungsten hexafluoride gas flow of about 300 to about 350 standard cubic centimeters per minute; and depositing at successive deposition stations a bulk, hydrogen reduced tungsten.

21. A method according to claim 20, and further comprising the step of introducing a continuous flow of argon with the initiation and nucleation gas flow.

22. A method according to claim 21, and further comprising the step of introducing argon in a continuous flow rate of about 10,000 to about 12,000 standard cubic centimeters per minute with the initiation and nucleation gas flow.

23. A method according to claim 21, and further comprising the step of introducing argon in a continuous flow rate of about 10,000 to about 12,000 standard cubic centimeters per minute at all deposition stations.

24. A method according to claim 20, wherein said deposition station comprises five deposition stations.

25. A method according to claim 20, and further comprising the step of introducing a hydrogen gas flow of about 7,000 to about 8,500 standard cubic centimeters per minute with the nucleation gas flow.

26. A method according to claim 20, wherein the backside gas flow comprises an argon and hydrogen gas flow.

27. A method according to claim 20, and further comprising the step of heating each plate to about 375 degrees centigrade.

28. A method according to claim 26, and further comprising the step of forming a 3,000 angstrom total tungsten film thickness.

* * * * *